United States Patent
Hsu et al.

(10) Patent No.: US 6,953,955 B2
(45) Date of Patent: Oct. 11, 2005

(54) INGAAS/GAAS HIGH ELECTRON MOBILITY TRANSISTOR

(75) Inventors: Wei-Chou Hsu, Tainan (TW); Ching-Sung Lee, Taichung (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 10/793,828

(22) Filed: Mar. 8, 2004

(65) Prior Publication Data

US 2004/0211955 A1 Oct. 28, 2004

(30) Foreign Application Priority Data

Apr. 25, 2003 (TW) .................................. 92109805 A

(51) Int. Cl.$^7$ .......................................... H01L 31/0328
(52) U.S. Cl. ...................... 257/194; 257/192; 257/200; 257/211; 257/281
(58) Field of Search ................................ 257/192, 194, 257/200, 211, 281

(56) References Cited

U.S. PATENT DOCUMENTS

| | | | |
|---|---|---|---|
| 4,833,508 A | 5/1989 | Ishikawa et al. ............... 357/4 |
| 5,021,361 A | 6/1991 | Kinoshita et al. ............ 437/129 |
| 5,430,310 A | 7/1995 | Shibasaki et al. ............ 257/190 |
| 5,844,261 A | 12/1998 | Kuo et al. .................... 257/194 |
| 6,448,119 B1 * | 9/2002 | Onda .......................... 438/172 |
| 6,747,297 B2 * | 6/2004 | Tanabe ........................ 257/194 |

* cited by examiner

Primary Examiner—Long Pham
Assistant Examiner—Wai-Sing Louie
(74) Attorney, Agent, or Firm—Troxell Law Office, PLLC

(57) ABSTRACT

An InGaAs/GaAs High Electron Mobility Transistor (HEMT) comprises a buffer layer, a main conducting channel, an InGaAs/GaAs thickness-graded superlattice structure, a mono atom δ-doped carrier supply layer, a Schottky cap layer of gate electrode and an Ohmic cap layer of drain electrode and source electrode which are formed successively on a substrate. The superlattice structure comprises spacer and sub-channel. By using thickness-graded superlattice spacer structure is able to ameliorate lattice-mismatch-induced scattering within heterostucture interfacial, increase range of gate voltage swing in gate electrode, and through real-space transfer generated by bias voltage in high electric field, drain-to-source saturation current proceed step-up phenomenon to forming a HEMT having scalable voltage multi-extrinsic transconductance enhanced portions.

15 Claims, 5 Drawing Sheets

INGAAS/GAAS HIGH ELECTRON MOBILITY TRANSISTOR

REFERENCE CITED

1. U.S. Pat. No. 5,844,261
2. U.S. Pat. No. 5,430,310
3. U.S. Pat. No. 5,021,361
4. U.S. Pat. No. 4,833,508

FIELD OF THE INVENTION

The invention relates to a transistor. More particularly, the invention relates to an InGaAs/GaAs High Electron Mobility Transistor (HEMT) having characteristic of scalable voltage multi-extrinsic transconductance enhanced.

DESCRIPTION OF THE RELATED ART

InGaAs is a compound having a high saturated velocity and high-speed intrinsic attributes material comprising low effective electron mass and a larger Γ–L internal band, which is applied generally as material of channel in High Electron Mobility Transistor (HEMT). Moreover, in design of integrated δ-doped technique with heterostucture, by using of superior transport property of mobility-two-dimensional concentration product to form important apparatus in general low mixed signal, high velocity and high power optical-current integrated circuit techniques.

According to the conventional technique, although InGaAs/GaAs heterostructure able to avoid existence of AlGaAs in deep energy level electron capture center (DX center), defects of lattice-mismatch-induced strain and scattering effect in GaAs heterostructure interfacial, influences substantially carrier transfer property and reduce effects of apparatus.

Furthermore, conventional HEMT only provides an extrinsic transconductance enhanced portion for circuit, also, signal operating range is limited by range of gate voltage swing of gate electrode in apparatus. Especially, multi-selective portions having multi-extrinsic transconductance enhanced generated by changing of bias voltage point is unable be afforded. For application in circuit usage of multi-position quantizer or analog/digital converter shows as analog-to-digital converter (ADC) and multi-state quantizer in high-speed mixed-mode IC applications.

SUMMARY OF THE INVENTION

One aspect of the present invention is to settle the above problems, for seeking a good carrier transport property within heterostructure interfacial and a superior HEMT design having multi-extrinsic transconductance enhanced effects.

Another aspect of the present invention is to provide a high attribute scalable multi-extrinsic transconductance enhanced HEMT structure. The transistor can simultaneously ameliorate substantially carrier transport property within heterostructure interfacial, increase gate voltage swing of gate electrode, enlarge characteristics such as input signal range and scalable voltage multi-extrinsic transconductance enhanced, which can directly apply in high-speed mixed-mode IC applications such as analog-to-digital converter (ADC) and multi-state quantizer.

For the above purposes, the means of present invention is selected from the group consisting of Metalorganic Chemical Vapor Deposition (MOCVD) and Molecular Beam Epitaxy (MBE) for analogic crystal heterostructure formed on S.I. GaAs substrate. By using thickness-graded InGaAs/GaAs superlattice structure as spacer and sub-channel of δ-doped HEMT, ameliorate phenomenon of lattice-mismatch-induced stress scattering which influences carrier transport property, also provide a prescriptive thickness of InGaAs/GaAs quatum well superlattice for superlattice spacer forming energy barrier-lowering phenomenon in bias voltage high electric field condition, leading to real-space transfer occurred by conducting carrier in sub-channel and main conducting channel to forming characteristic of having multi-extrinsic transconductance enhanced operating portions.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

The following descriptions of the preferred embodiments are provided to understand the structures and the procedures of the present invention.

Figure 1:
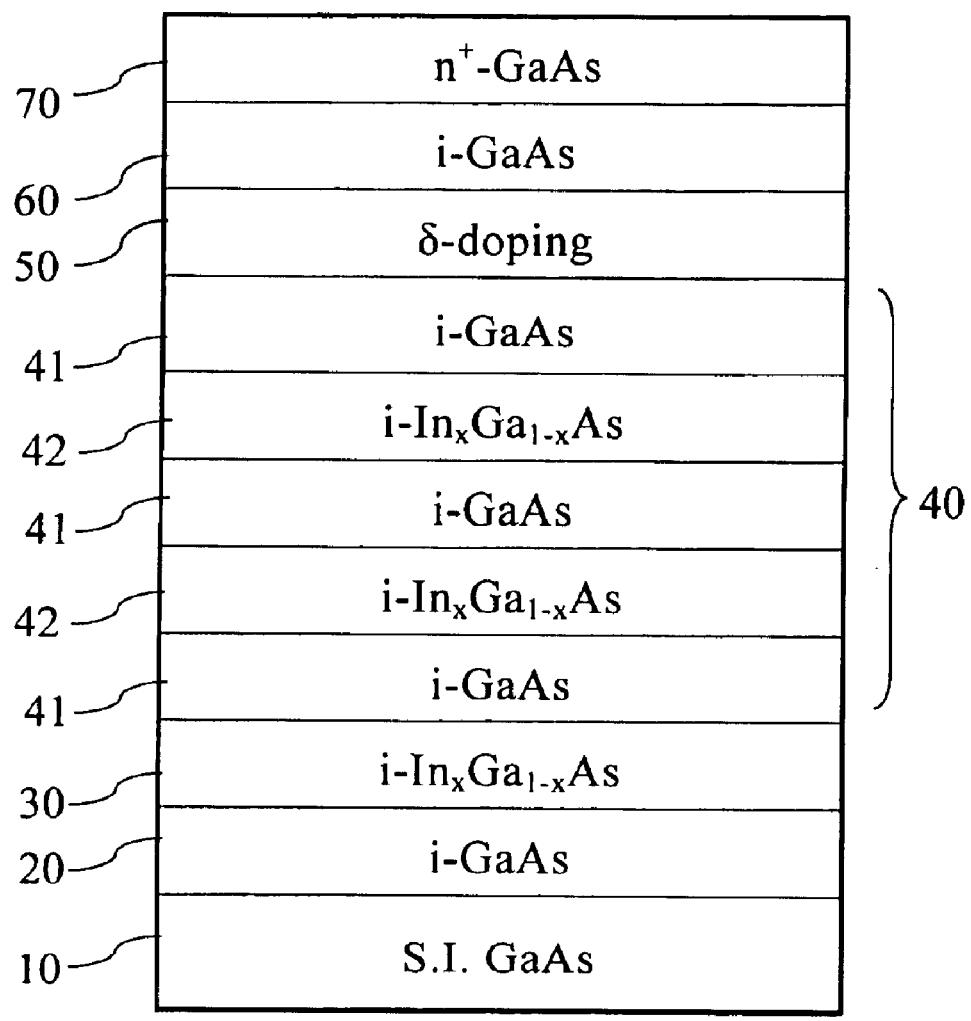
FIG. 1 is a schematic cross-sectional view of an InGaAs/GaAs High Electron Mobility Transistor (HEMT) according to the present invention.

FIG. 1 illustrates a schematic cross-sectional view of a InGaAs/GaAs High Electron Mobility Transistor (HEMT) according to the present invention, comprised of a substrate 10, a buffer layer 20 formed on the substrate 10, a main conducting channel 30 formed on the buffer layer 20, a superlattice structure 40 formed on the main conducting channel 30, a carrier supply layer 50 formed on the superlattice structure 40, a Schottky cap layer of gate electrode 60 and finally an Ohmic cap layer 70 of drain electrode and source electrode deposited on the top of whole device.

The substrate 10 is a GaAs. The Epitaxial structure formed on the substrate 10 by using techniques from the group consisting of Metal-Organic Chemical Vapor Deposition (MOCVD) method and Molecular Beam Epitaxy (MBE).The buffer layer 20 is an undoped GaAs with a thickness in the range of 0.1 to 5.0 micro meters. The main conducting channel 30 is an undoped InGaAs having general form $In_xGa_{1-x}As$ with a thickness in the range of 60 to 100 Angstroms, wherein x is in the range of 0 to 0.3.

The superlattice structure 40 is formed of a thickness-graded InGaAs/GaAs having a total thickness in the range of 20 to 300 Angstroms, comprised of the spacer 41 which is formed of an undoped GaAs having a thickness in the range of 10 to 50 Angstroms and the sub-channel 42 which is formed of an undoped InGaAs having a thickness in the range of 5 to 35 Angstroms and a general form $In_xGa_{1-x}As$, wherein x is in the range of 0 to 0.3.

The carrier supply layer 50 is formed of a two-dimensional δ-doped GaAs with a concentration in the range of $δ(n)=1×10^{11}$~$1×10^{13}$ cm$^{-2}$. The Schottky cap layer of gate electrode 60 is selected from the group consisting of an undoped GaAs with a thickness of 100 Angstroms to 1 micro meter and an undoped InGaP having a general form as $In_xGa_{1-x}P$ with a thickness in the range of 100 Angstroms to 1 micro meter, wherein x is in the range of 0.48 to 0.51.

The Ohmic cap layer 70 of drain electrode and source electrode is selected from the group consisting of an undoped GaAs having a thickness in the range of 100 Angstroms to 1 micro meter, and a n-type GaAs having a thickness in the range of 100 Angstroms to 1 micro meter and a concentration in the range of $n=1×10^{18}$~$1×10^{19}$ cm$^{-3}$.

Apparatus of an InGaAs/GaAs High Electron Mobility Transistor (HEMT) according to the present invention is described below. An undoped GaAs buffer layer 20 of 0.5 micro meters thickness and an undoped InGaAs main conducting channel 30 of 80 Angstroms thickness having a general form $In_{0.24}Ga_{0.76}As$ is grown successively on the GaAs substrate 10 by using a Molecular Beam Epitaxy (MBE) method. And then, a thickness-graded InGaAs/GaAs superlattice structure 40 having a 15-Angstrom thick GaAs, 20-Angstrom thick $In_{0.28}Ga_{0.72}As$, 30-Angstrom thick GaAs, 10 Angstrom thick $In_{0.28}Ga_{0.72}As$, and 45-Angstrom thick GaAs is grown to form a spacer 41 and a sub-channel 42. Furthermore, a two-dimensional δ-doped GaAs layer is grown by using a concentration of $5×10^{12}$ cm$^{-2}$ for obtaining a carrier supply layer 50. This doped approach is attached by closing the growing gate of Gallium(Ga) while GaAs is in expitaxial condition, add simultaneously silicon silane of doping source to keep opening the growing gate of arsenic for forming a two-dimensional δ-doped GaAs quantum well thin film having a high doped concentration.

Thereafter, an undoped GaAs Schottky cap layer of gate electrode 60 of 200 Angstroms thick is grown, followed by a n-type doped GaAs Ohmic cap layer of drain electrode and source electrode 70 of 100 Angstroms is grown. Wherein growing temperature of the substrate and other expitaxial layer are 600 Celsius and 625 Celsius respectively.

A manufacturing method of an InGaAs/GaAs High Electron Mobility Transistor (HEMT) according to the present invention is described below. A InGaAs/GaAs High Electron Mobility Transistor (HEMT) according to the present invention is fabricated by using typical photolithography and Lift-Off techniques, combined with vacuumed evaporation. Subsequently, by evaporating Ag, alloy of Au and Ge (AuGe) and Ni in order on surface of the top of undoped GaAs as a drain electrode and a source electrode, thereafter, a forming gas which is comprised of 90% nitrogen and 10% hydrogen is added. Followed by subjecting to a quenching at temperature in the range of 300 to 500 Celsius forms a conducting of Ohmic cap layer 70 as a drain electrode, a source electrode and channel. Next, immerse the apparatus into etching solution after process of photoresisting, exposuring and developing for etching undoped GaAs buffer layer in the form of a Mesa Etching. Also, evaporating gold (Au) to undoped GaAs Schottky cap layer 60 as gate electrode of Schottky cap layer, wherein the gate electrode have a thickness in the range of 100 Angstroms to 1 micro meter, while the drain electrode and source electrode is formed in the order of Ag/AuGe/Ni having a total thickness in the range of 200 Angstrom and 1 micro meter.

For further comparing the amelioration of carrier transport property within heterostructure interfacial generated by a thickness-graded InGaAs/GaAs superlattice spacer structure according to the present invention with conventional techniques, in same epitaxial condition, grows a conventional undoped GaAs spacer (known as structure B) having a purity structure of 80 Angstroms thickness to substitute InGaAs/GaAs superlattice spacer structure (known as structure A) according to the present invention, by using comparisons in characteristics such as mobility of electron which is measured by Hall measurement and concentration of two-dimensional electron.

In the addition of a magnetic field intensity of 5000 Gauss, Hall measurement is proceeded by a temperature in the range of 30 K to 300 K to measure the changes of temperature, result of experiment is as below: same at temperature 30 K, in structure A, resulted a mobility of electron of 12600 cm$^2$/V-s and a concentration of electron of $2.1×10^{12}$ cm$^{-2}$, while in structure B, resulted a mobility of electron of 6380 cm$^2$/V-s and a concentration of electron of $1.8×10^{12}$ cm$^{-2}$. In the condition of temperature at 300 K, in structure A, resulted a mobility of electron of 4250 cm$^2$/V-s and a concentration of electron of $2.8×10^{12}$ cm$^{-2}$, while in structure B, resulted a mobility of electron of 2930 cm$^2$/V-s and a concentration of electron of $2.3×10^{12}$ cm$^{-2}$. With reference to the above experiments, a designed temperature in a range of 30 K to 300 K in structure A according to the present invention, shows a significant amelioration of mobility of electron, increased respectively by double multiples and 31% compared to the conventional structure. While in mobility-concentration product aspect, structure A ameliorating range is 2.3 multiples at temperature of 30 K and 43% at temperature of 300 K respectively.

In addition, problem of lattice-mismatch-induced strain within heterostructure interfacial which influences carrier transport velocity due to scattering influence occurs between undoped GaAs spacer and InGaAs channel of conventional structure. However, by using the thickness-graded superlattice structure according to the present invention, lattice stress between GaAs Schottky cap layer and InGaAs channel can be reduce gradually, also, scattering influence can be descended for ameliorating heterostructure interfacial and improving mobility of electron.

Furthermore, a thickness-graded InGaAs/GaAs superlattice spacerin structure A according to the present invention has a total thickness of 120 Angstroms. While a GaAs spacer in structure B according to conventional structure only have a thickness of 80 Angstroms. Theoretically, structure A must have a smaller capability of gate electrode modulation, however, by ameliorating of heterostructure interfacial quality by using thickness-graded superlattice spacer, a better characteristics of apparatus can be produced.

For a gate electrode of transistor have a dimension of 1.5×200 $μm^2$ under room temperature, threshold voltage in structure A and structure B is −2.2 V and −1.6 V respectively, further showing a significant broader range of gate voltage swing occurred in the present invention than that of conventional technique.

Figure 2:
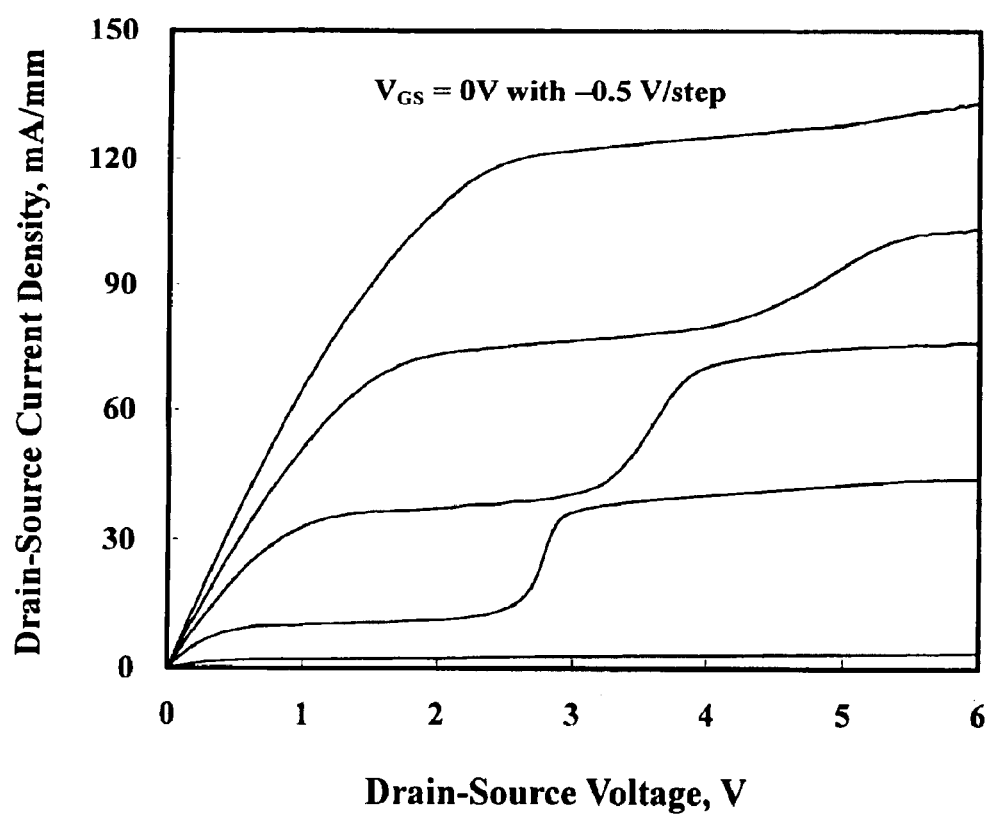
FIG. 2 is a graph showing specific curves of drain-source voltage and drain-source current density under room temperature according to the present invention.

As illustrated in FIG. 2, is a graph showing specific curves of drain-source voltage and drain-source current density under room temperature according to the present invention. Faceplate of gate electrode has a dimension of 1.5×200 $μm^2$. Distance of drain electrode and source electrode is 10 micro meters, while bias voltage of gate electrode and source electrode is descending to −2 V from 0 V by an equal difference of 0.5 V. In the condition of bias voltage of low drain electrode and source electrode, drain electrode current is increased gradually to a saturation current value by depending on increasing of external bias voltage. However, while external bias voltage is increased to high electric field intensity, saturation current of drain electrode and source electrode will produce step-up phenomenon. Also, initial point of external bias voltage of drain electrode and source electrode is descended by depending on descending of bias voltage of gate electrode and source electrode, which is determined by influence of effective electric field intensity in channel.

Figure 3A:
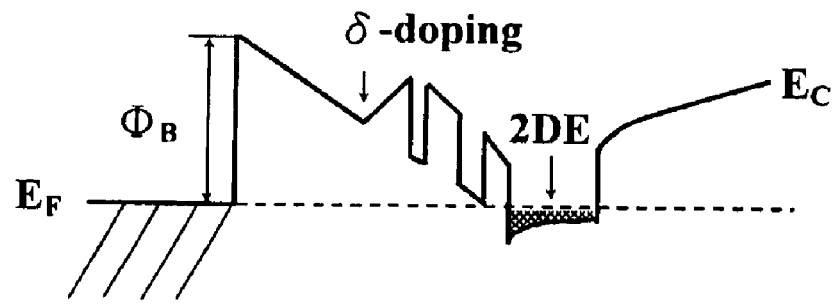
FIG. 3a is a view showing a conduct band in low-channel electric field intensity according to the present invention.
Figure 3B:
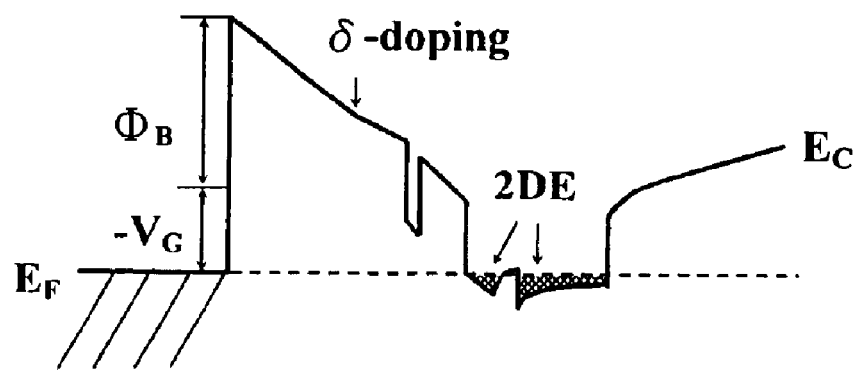
FIG. 3b is a view showing a conduct band in high-channel electric field intensity according to the present invention.

Please referring to FIG. 3a and FIG. 3b, views illustrate a conduct band in step-up increasing phenomenon of drain-to-source saturation current.

As illustrated in FIG. 3a, transistor under low-bias voltage of drain electrode and source electrode, since quantum well in InGaAs/GaAs superlattice structure has a smaller width than Debye length, also, subband in quantum well is higher than height of Fermi level in main conducting channel, and failing of absorption of electron is caused. Thereby, conducting carrier is totally limited in main conducting channel, and absence of parallel conducting phenomenon.

As illustrated in FIG. 3b, when external bias voltage of drain electrode and source electrode is increased, spacer which is generated by uncontinuing InGaAs/GaAs quantum well superlattice conduct band resulted of high-channel electric field intensity produce an energy barrier-lowering phenomenon, leading to conducting carrier in main conducting channel is changed to high-Indium component from low-Indium component through real-space transfer, with a higher-velocity parallel conducting in sub-channel.

Equivalent total of drain-to-source saturation current is increased depends on step-up increasing to form output specific curves illustrated in FIG. 2.

In real-space transfer, because of uncontinuing differences of conduct bands between $In_{0.24}Ga_{0.76}As$/GaAs and $In_{0.28}Ga_{0.72}As$/GaAs is 0.2 eV and 0.23 eV respectively, while difference of $\Gamma$–L band in $In_{0.24}Ga_{0.76}As$ main conducting channel is 0.52 eV, all of them is higher than uncontinuing difference power of conduct band. Comparing real-space transfer with $\Gamma$–L band transfer, a lower threshold field is occurred, therefore, real-space transfer is the important part in current step-up increasing phenomenon according to the present invention.

Figure 4:
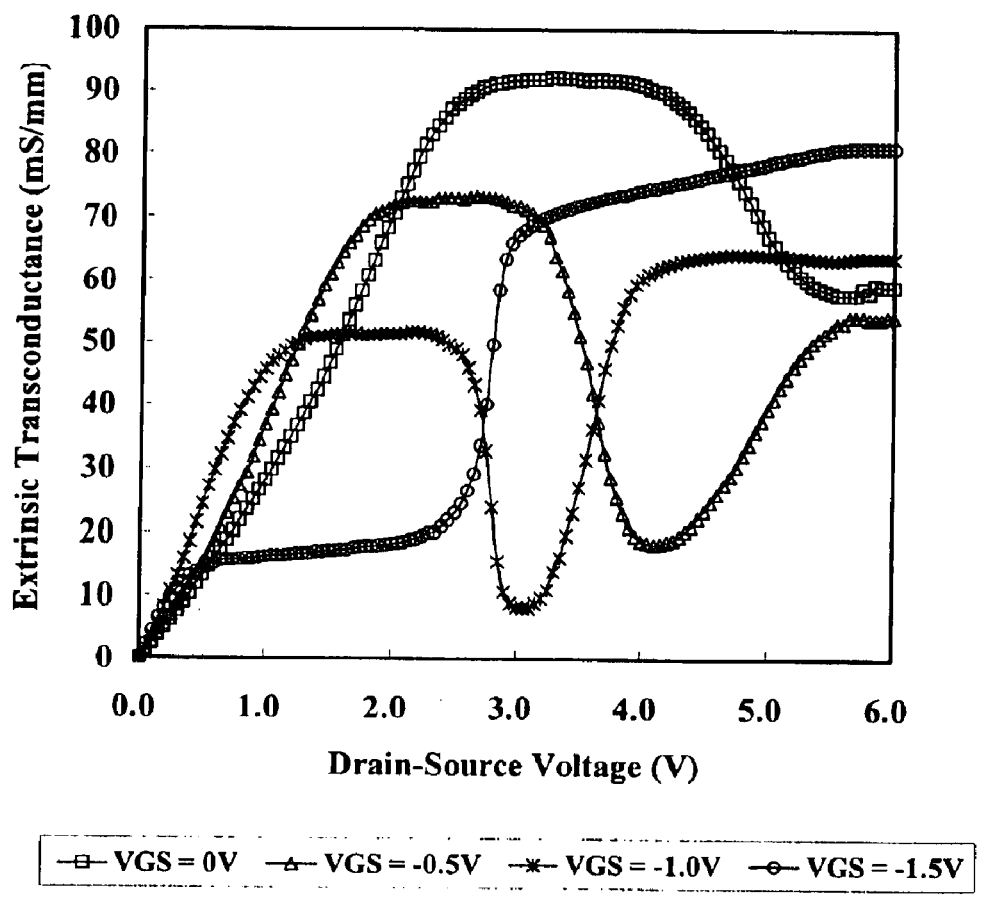
FIG. 4 is a graph showing specific curves of drain-source voltage and extrinsic transconductance under room temperature according to the present invention.

With further reference to FIG. 4, is a graph showing output specific curves of extrinsic transconductance parameter under room temperature according to the present invention. As shown in FIG. 4, the present invention has a scalable voltage multi-extrinsic transconductance enhanced flat portions, wherein different bias voltage, mono apparatus provides characteristic of multi-enhanced selective apparatus.

In condition of an 3V external bias voltage of drain electrode and source electrode, the input signal of gate electrode and source electrode has a direct voltage of 0 V, –0.5 V and –1.0 V respectively, and transistor provides relatively an extrinsic transconductance enhanced of 92 mS/mm 72 mS/mm and 8.5 mS/mm respectively. While transistor is operated in common gate electrode current, in the condition of gate electrode is connected to ground, the bias voltage of drain electrode is 1.5 V, 3.0 V and 4.5 V respectively, its relative extrinsic transconductance value is 51 mS/mm, 8.5 mS/mm and 63 mS/mm respectively. In each enhanced section, its maximum signal swing is 1.5 V in a flat and broad range.

The flat scalable voltage multi-extrinsic transconductance operating portions and enlarged multiple of high discriminability, can directly applied in mixed-mode IC applications such as anolog-to-digital converter (ADC) and multi-state quantizer.

According to the above structure and experiments, the present invention ameliorates substantially defects of conventional HEMT, comprising the characteristics of:

1. Applying thickness-graded InGaAs/GaAs quantum well superlattice structure in spacer and sub-channel of δ-doped HEMT, to alleviate lattice-mismatch-induced strain within heterostucture interfacial and scattering effect, ameliorate substantially carrier transport property in heterostucture interface.

2. The barrier potential is generated by thickness of thickness-graded InGaAs/GaAs quantum well superlattice structure and discontinuing conduct band of quantum well. In the condition of bias voltage of high-channel electric field intensity leading to conducting carrier in main conducting channel is changed to high-Indium component from low-Indium component through real-space transfer, with a higher-velocity parallel conducting in sub-channel to form equivalent gathering drain-to-source saturation current having distinguished device characteristics such as step-up and scalable voltage multi-extrinsic transconductance enhanced.

3. In an integrate spacer and channel in InGaAs/GaAs superlattice structure and InGaAs to achieve a better current transfer capability in HEMT, a broader gate electrode in gate voltage swing portions and a broader range in input signal.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. An InGaAs/GaAs high electron mobility transistor (HEMT) comprising:
   a substrate;
   a buffer layer overlying said substrate;
   a main conducting channel overlying said buffer layer;
   a thickness-graded superlattice structure overlying said main conducting channel to form spacer and sub-channel;
   a mono atom δ-doped carrier supply layer overlying said thickness-graded superlattice structure;
   a Schottky cap layer of gate electrode overlying said mono atom δ-doped carrier supply layer; and
   an Ohmic cap layer of drain electrode and source electrode overlying said Schottky cap layer of gate electrode.

2. The transistor according to claim 1, wherein said substrate is a GaAs.

3. The transistor according to claim 1, wherein said buffer layer is an undoped GaAs with a thickness in the range of 0.1 to 5.0 micro meters.

4. The transistor according to claim 1, wherein said main conducting channel is an undoped InGaAs having general form $In_xGa_{1-x}As$ with a thickness in the range of 60 to 100 Angstroms, wherein x is in the range of 0 to 0.3.

5. The transistor according to claim 1, wherein said spacer is an undoped GaAs having a thickness in the range of 10 to 50 Angstroms, and said sub-channel is an undoped InGaAs having a thickness in the range of 5 to 35 Angstroms and a general form $In_xGa_{1-x}As$, wherein x is in the range of 0 to 0.3.

6. The transistor according to claim 1, wherein said thickness-graded superlattice structure has a total thickness in the range of 20 to 300 Angstroms.

7. The transistor according to claim 1, wherein said mono atom δ-doped carrier supply layer has a concentration in the range of $\delta(n)=1\times10^{11}\sim1\times10^{13}$ cm$^{-2}$.

8. The transistor according to claim 1, wherein Schottky cap layer of gate electrode is an undoped GaAs with a thickness of 100 Angstroms to 1 micro meter.

9. The transistor according to claim 1, wherein said Schottky cap layer of gate electrode is an undoped InGaP having a general form as $In_xGa_{1-x}P$ with a thickness in the range of 100 Angstroms to 1 micro meter, wherein x is in the range of 0.48 to 0.51.

10. The transistor according to claim 1, wherein top of said Ohmic cap layer of drain electrode and source electrode is an undoped GaAs having a thickness in the range of 100 Angstroms to 1 micro meter.

11. The transistor according to claim 1, wherein top of said Ohmic cap layer of drain electrode and source electrode is a n-type GaAs having a thickness in the range of 100 Angstroms to 1 micro meter and a concentration in the range of $n=1\times10^{18}\sim1\times10^{19}$ cm$^{-3}$.

12. The transistor according to claim 1, wherein said transistor form being selected from the group consisting of Metal-Organic Chemical Vapor Deposition (MOCVD) and Molecular Beam Epitaxy (MBE).

13. The transistor according to claim 1, wherein said gate electrode is a gold (Au) with a thickness in the range of 100 Angstroms to 1 micro meter.

14. The transistor according to claim 1, wherein said drain electrode and source electrode is a Ag/AuGe/Ni with a total thickness in the range of 200 Angstroms to 1 micro meter.

15. The transistor according to claim 1, wherein said drain electrode and source electrode form Ohmic contact with said main conducting channel by using quenching of temperature in the range of 300 to 500 Celsius.

* * * * *